(12) United States Patent
Rahn et al.

(10) Patent No.: US 6,518,840 B1
(45) Date of Patent: Feb. 11, 2003

(54) CIRCUIT FOR LINEARIZING THE POWER CONTROL PROFILE OF A BICMOS POWER AMPLIFIER

(75) Inventors: David George Rahn, Kanata (CA); Marquis Christian Julien, Kinburn (CA)

(73) Assignee: SiGe Semiconductor Inc., Ottawa (CA)

( * ) Notice: Subject to any disclaimer, the term of this patent is extended or adjusted under 35 U.S.C. 154(b) by 0 days.

(21) Appl. No.: 09/496,047

(22) Filed: Feb. 2, 2000

(51) Int. Cl.[7] .............................. H03F 1/30; H03G 3/10; H04L 29/49
(52) U.S. Cl. ...................... 330/149; 330/284; 330/285; 375/296; 375/297
(58) Field of Search ................................. 330/149, 284, 330/285; 375/296, 297

(56) References Cited

U.S. PATENT DOCUMENTS

| | | | | |
|---|---|---|---|---|
| 4,115,741 A | * | 9/1978 | Skutta | 330/284 |
| 5,021,747 A | * | 6/1991 | Isham et al. | 330/284 |
| 5,697,081 A | * | 12/1997 | Lyall, Jr. et al. | 330/149 |

* cited by examiner

Primary Examiner—Patricia T. Nguyen
(74) Attorney, Agent, or Firm—Freedman & Associates

(57) ABSTRACT

A two stage amplifier for a portable or cellular phone is disclosed which is manufactured using a fast BiCMOS process suach as SiGe. A shunt circuit controlled by a switch is provided between a base of one of the amplifying transistors and a DC terminal to prevent it from operating in a Class B mode of operation when it is intended for the amplifier to be switched off.

22 Claims, 3 Drawing Sheets

CIRCUIT FOR LINEARIZING THE POWER CONTROL PROFILE OF A BICMOS POWER AMPLIFIER

FIELD OF THE INVENTION

The present invention relates to an amplifying circuit for a portable radiotelephone and, more particularly, to a circuit and method for controlling the power transmitted by a portable radiotelephone.

BACKGROUND OF THE INVENTION

A power amplifier (PA) is used in a wireless communication device such as a cellular radiotelephone to amplify radio frequency (RF) signals so that the device can communicate with a fixed site transceiver. Considerable power in a wireless communication device is dissipated in the power amplifier. For example, in a portable cellular radiotelephone, a significant percent of the power dissipation is in the power amplifier. Efficiencies of a power amplifier significantly depend upon the source and load variations the power amplifier experiences over the operating frequency of a cellular radiotelephone. One problem associated with designing a high-efficiency power amplifier is adequately compensating for these source and load variations.

Wireless communication devices typically transmit radio frequency signals at a plurality of power levels. For example, cellular radiotelephones require seven 4 dB steps in output power of the radio transmitter. However, the efficiency of the power amplifier significantly varies over the output power range. Because current drain efficiency of the power amplifier is most affected at a higher output power, the power amplifier is designed to maximize efficiency at higher output power levels. One technique to improve power efficiency requires switching the quiescent current of the power amplifier in response to a power amplifier output step change. At the lowest power step, the power amplifier is normally in class A mode of operation. By changing the bias conditions of the power amplifier at the lower steps, the power amplifier could be kept in class AB mode with a corresponding improvement in efficiency.

Operational efficiency is also particularly dependent on the load impedance variation caused by impedance changes of the duplex filter over a wide bandwidth or environmental factors such as the placement of a user's hand or body near the antenna. The power amplifier is generally designed with the saturated output power higher than the typical operating output power to accommodate power fluctuations caused by load impedance variations. To compensate for the reduced efficiency of the power amplifier designed at such a higher output power, the load at the output of the power amplifier can be varied by switching a diode in or out at the output. For example, a dual mode power amplifier operates in either the linear mode or the saturation mode based upon load switching. This load switching accommodates operation of the device on two different cellular radiotelephone systems. However, such discrete switching of the load at the output provides some improvement in efficiency, but does not maximize efficiency.

Improving the power amplifier efficiency is essential to increasing the operating time for a given battery of the wireless communication device. Accordingly, there is a need for a method and apparatus for amplifying a radio frequency signal with greater efficiency over source and load variations. There is also a need for operating a power amplifier efficiently over a wide range of operating voltages.

A portable (e.g., hand-held) radiotelephone (e.g., cellular phone) which is designed to operate in dual modes generally requires different radiating power levels for each of its modes. As such, each mode requires different battery power to operate. Conventional dual mode portable radiotelephones, however, are designed having power supplies (batteries) that generate power at levels to accommodate the mode requiring the most power to operate. As a result, unnecessary power is dissipated while the portable radiotelephone is operating in the mode, which requires less power, which results in a shortened battery life.

In addition to the different power requirements of dual mode portable radiotelephones, portable radiotelephones may also transmit signals at different power levels depending on the area in which they are operated. Specifically, the dual mode portable radiotelephone can effectively communicate with low power in a region exhibiting a strong electric field, i.e., in the proximity of a base station, but requires high power to communicate in a region exhibiting a weak electric field, i.e., in a remote place from the base station. In any event, dual mode portable radiotelephones are generally used in close proximity to the base station, i.e, a region of strong electric field. Therefore, on average, dual mode portable radiotelephones can operate with lower transmitting power levels.

In the conventional portable radiotelephone, however, the voltage applied to the power amplifier 30 for amplifying the transmission signals is set at 3.3 V in consideration of the situation where the portable radiotelephone is operating in a region of a weak electric field, which requires higher transmission power levels to communicate effectively. Therefore, since the 3.3 V applied to the power amplifier remains constant even when the portable radiotelephone is operating in a region exhibiting a strong electric field (which requires less power), unnecessary power is dissipated resulting in shortening the battery life. Moreover, the temperature of the portable radiotelephone increases, which adversely affects the circuitry.

Referring to FIG. 1, a diagram illustrating a power supply circuit of a conventional portable radiotelephone is shown. The power supply circuit of the conventional portable radiotelephone includes a power supply 10 ("battery"), a DC-to-DC Converter 20 connected to the output of battery 10, an inductor L1 connected to the output of the DC-to-DC converter, a pair of voltage dividing resistors R1 and R2, which are serially connected between the output of the DC-to-DC converter 20 and a ground, a power amplifier 30 and a linear regulator 31, which are connected to the output of the DC-to-DC converter 20, and a capacitor C 1 connected between an input to the power amplifier 30 and ground.

The output voltage of the DC-to-DC converter 20 is determined by the voltage dividing resistors R1 and R2. In the conventional method, the resistance values of resistors R1 and R2 are preset so that the required 3.3 V is applied to the power amplifier 30.

In a dual stage power amplifier having a first pre-amplifying stage coupled with a second amplifying stage coupled with a transmitting antenna of a cellular phone it is desired to lessen the output power provided to the transmitting antenna under certain circumstances. For example, when a transmitting cellular phone is very close to a fixed site transceiver to which it is transmitting, there is no advantage in outputting a substantially high power output signal when less power will suffice. In other instances, it may be advantageous to completely switch off the transmitting amplifier for a short interval of time. This can be accomplished by providing less input power to the input stage of the dual stage amplifier, or, alternatively the output power of the transistors used as the first and second amplifying stages can be controlled so as to lessen the intensity of their output by controlling a biasing voltage thereon.

It is well known to control the output power of a first and second stage amplifying transistor of a two stage system as is shown in prior art FIG. 2 by controlling the DC collector voltage provided to the collectors 26a and 26b of the first stage transistor 20a and the second stage transistor 20b respectively. Thus, by lowering VCC1 and VCC2 the output power at the terminal OUT of an input signal coupled into the terminal labeled IN is lessened. In this configuration for example with the antenna in a receive mode, switching off the second power transistor is accomplished by switching off the power from the battery VCC2. In order to lessen the power to the terminal OUT of the collector 26b a variable attenuator or switch providing a variable voltage drop is utilized between VCC2 and the terminal OUT. One disadvantage of this arrangement is that power wasted when voltage drop occurs across the variable attenuator Rvar. In instances where maximum voltage is applied between VCC2 and the terminal OUT, an unwanted voltage drop remains across the variable attenuator Rvar, even when it is selected to have its least resistance. Thus in one instance where it is desired to limit the collector current, power dissipated by the attenuator Rvar is wasted. In the other instance where it is desired to provide maximum power, a small voltage drop across Rvar limits the maximum voltage that can be provided to the collector 20b of the second stage transistor.

It would be preferred to provide an amplifier wherein the base bias voltage were varied in a controlled manner such as to control the amplifier's output power. This is particularly advantageous since less current is required to bias the base than was used heretofore, shown in FIG. 2, for biasing the collector.

It is an object of this invention to provide a novel solution to this and other problems inherent in many prior art amplifying circuits.

It is an object of this invention to provide a circuit wherein a first switch of a serial switch combination thereof is provided to control the on-off state of one or more base bias blocks for biasing the base of the amplifier's transistors.

It is a further object to provide a second switch of the serial switch combination wherein the second switch controlling the base bias voltage is variable in contrast to the binary on-off nature of the first switch.

It is a further object of the invention to provide means for ensuring that small signals present at the base of the pre-amplifying transistor are extinguished to prevent an RF signal at the base of the transistor to allow the amplifier to operate in a Class B mode.

Yet still further, it is an object of the invention to provide a means of substantially linearizing the response of the output power of the amplifier and a variable control voltage that is utilized to control the amplifier's output power response.

And yet still further, it is an object of this invention to provide a fast BiCMOS circuit that will provide the aforementioned features and advantages.

SUMMARY OF THE INVENTTION

In accordance with the invention, a two-stage amplifier for a portable or cellular phone is provided which is manufactured using a fast BiCMOS process such as SiGe having a shunt circuit controlled by a switch. The shunt attenuator is provided between a base of one of the amplifying transistors and a DC terminal to prevent the amplifier from operating in a Class B mode of operation when it is intended for the amplifier to be switched off.

In accordance with the invention, a BiCMOS circuit is provided for amplifying an input signal comprising:
a) a first transistor having a base, a collector and an emitter, the base for receiving the input signal, the first transistor for pre-amplifying the input signal to provide a pre-amplified signal;
b) a second transistor having a base, emitter and collector, the base being coupled with the first pre-amplifying transistor for receiving and amplifying the pre-amplified signal;
c) a first bias block generator for receiving a variable voltage and for biasing the base of one of the first and second transistors to a plurality of operating states; and,
d) a circuit coupled to the base of at least one of the first and second transistors for variable shunting AC signals present at the base of one of the first and second transistors to a distal location from the base, in dependence upon the variable voltage.

In accordance with the invention, a BiCMOS power amplifier is provided comprising:
a first bipolar junction transistor having a base, a collector and an emitter;
a control voltage terminal for biasing the base of the bipolar junction power transistor and for providing a plurality of voltage values to the base; and,
a circuit for shunting unwanted AC signals present at the base of the first bipolar junction transistor to a distal location from the base, said circuit for shunting in proportion to a magnitude of a control signal.

In accordance with the invention, a BiCMOS amplifying circuit for amplifying an input signal is provided comprising:
a first pre-amplifying transistor having a base, a collector and an emitter, the base being an input port for receiving the input signal, the pre-amplifying transistor for pre-amplifying the input signal to provide a pre-amplified signal;
a second amplifying transistor having a base, emitter and collector, the base being coupled with the first pre-amplifying transistor for receiving the pre-amplified signal;
a first bias block generator for biasing the base of one of the first pre-amplifying transistor and the second amplifying transistor; and,
a switch for controlling the first bias block between a plurality of operating states, and, means responsive to the switch or a voltage coupled therewith, and coupled to the base of one of the first pre-amplifying transistor and the second amplifying transistor for ensuring that small unwanted signals at the base of one of the first pre-amplifying transistor and the second amplifying transistor are diverted from the base and are substantially extinguished.

In accordance with the invention a BICMOS power amplifier is provided comprising:
a bipolar junction power transistor having a base, a collector and an emitter;
a control voltage terminal for biasing the base of the bipolar junction power transistor and for providing a plurality of voltage values to the base;
a linearizing circuit coupled with the base of the transistor wherein the linearizing circuit includes a MOS transistor in parallel with a resistor having a resistance value of at least 2 k ohms.

In accordance with the invention a BiCMOS amplifying circuit for amplifying an input signal is provided comprising:

a first pre-amplifying transistor having a base, a collector and an emitter, the base being an input port for receiving the input signal, the pre-amplifying transistor for pre-amplifying the input signal to provide a pre-amplified signal;

a second amplifying transistor having a base, emitter and collector, the base being coupled with the first pre-amplifying transistor for receiving the pre-amplified signal; a first bias block generator for biasing the base of one of the first pre-amplifying transistor and the second amplifying transistor; and, a first and second switch in series and coupled with the base of at least one of the first pre-amplifying transistor and the second amplifying transistor for controlling a current or voltage provided to the first bias block, the first switch having a first on state and a second off state and the second switch having a plurality of variable states between an on state and an off state to provide a variable voltage or current.

BRIEF DESCRIPTION OF THE DRAWINGS

Exemplary embodiments of the invention will now be described in conjunction with the drawings in which.

DETAILED DESCRIPTION

Figure 1:
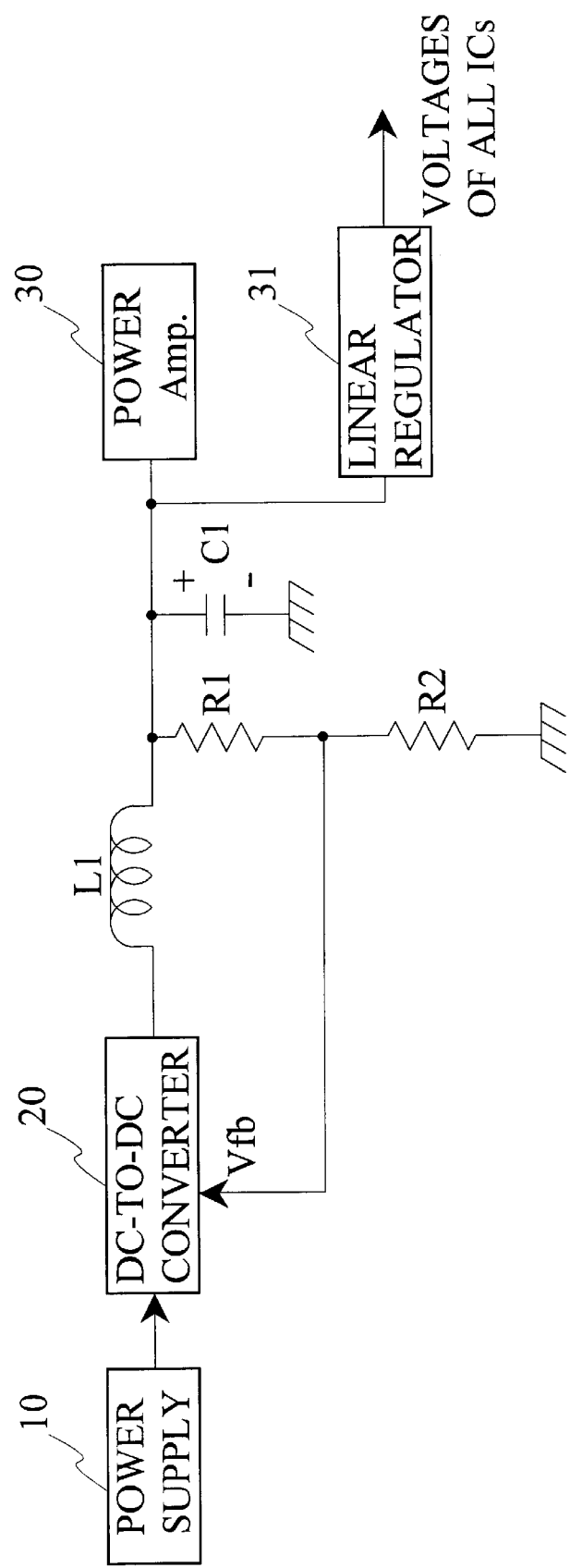
FIG. 1 is a schematic block diagram of a prior art amplifying circuit.
Figure 2:
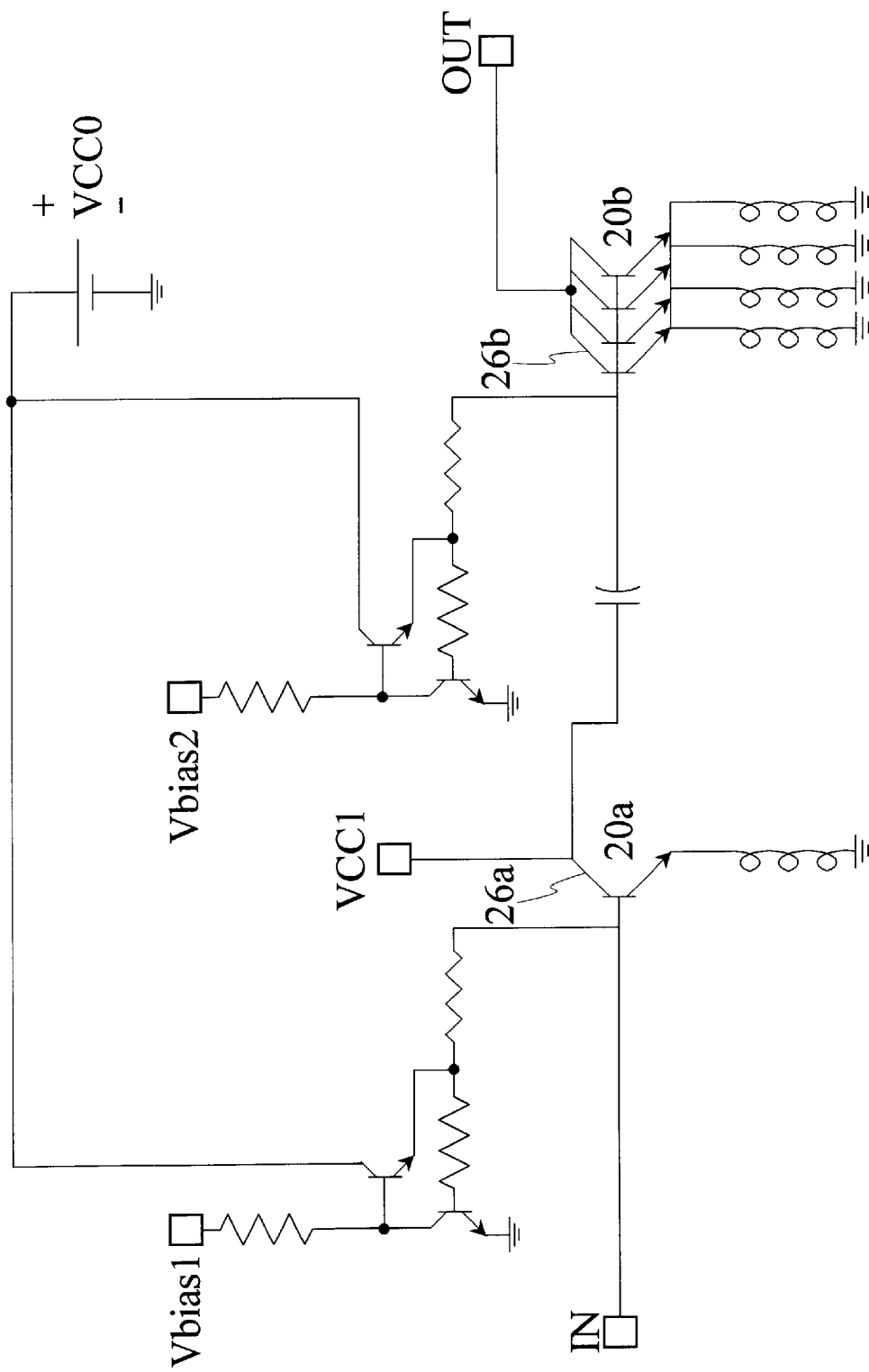
FIG. 2 is a schematic of a prior art dual stage amplifier having the operation of the transistors controlled by providing a variable voltage to the transistor collectors.
Figure 3:
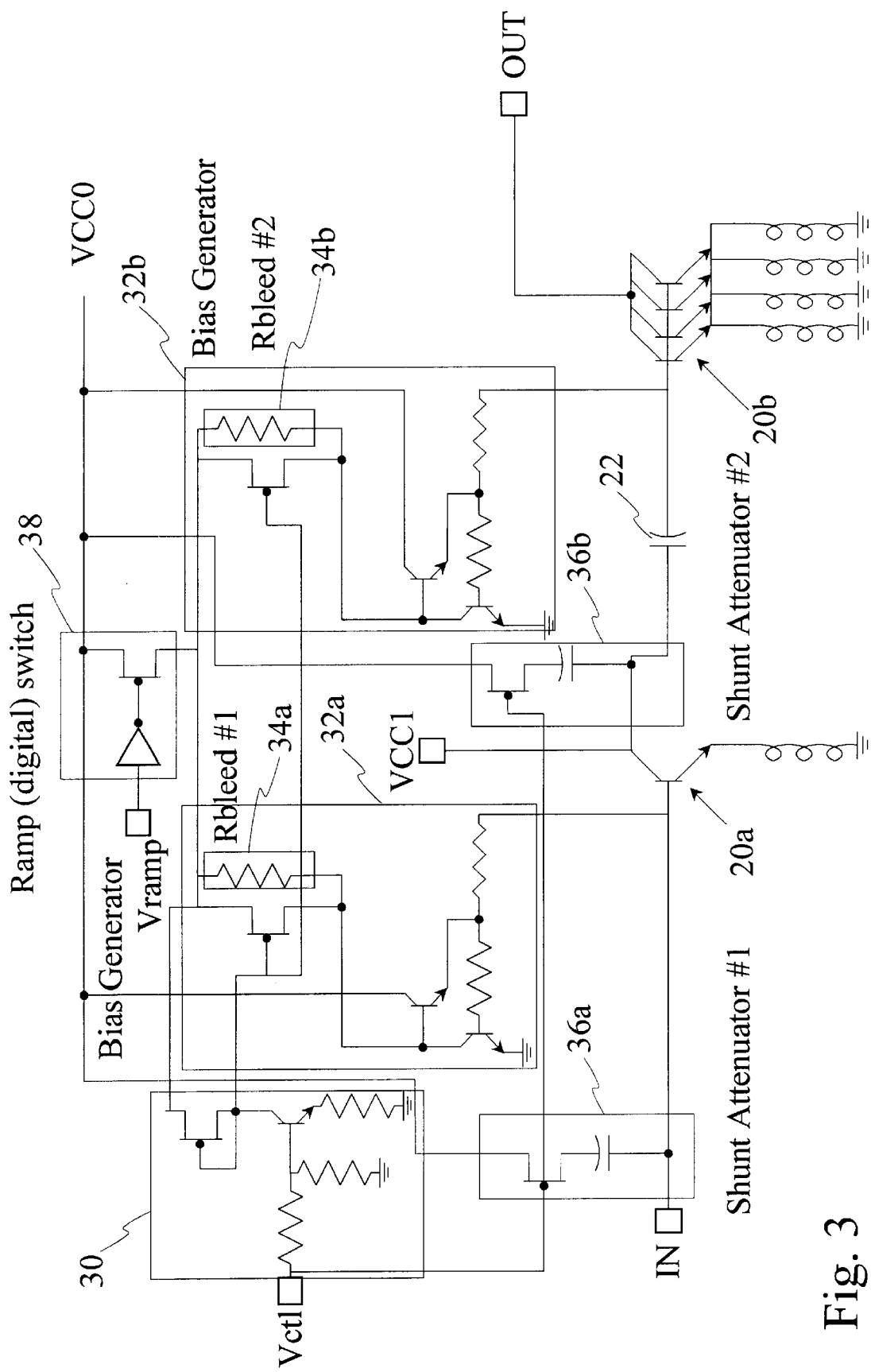
FIG. 3 is a schematic diagram of a two-stage amplifying circuit in accordance with this invention.

Turning now to FIG. 3, a circuit is shown having a first pre-amplifying transistor 20a, followed by a power amplifying transistor 20b coupled through a capacitor 22 for allowing an AC signal to pass to the base of the transistor 20b. Two terminals Vctl and Vramp are provided to control the operation of the amplifier embodied in the circuit. Vramp provides switching on or off the amplifier, and Vctl in the presence of an applied voltage provides various levels of amplification in dependence upon the applied voltage value. Therefore, when it is provided with a voltage the amplifier is switched on to a level determined by the voltage value of Vctl. Conversely, when Vramp is switched off, the value of Vctl does not affect the amplifier, which is switched off.

A voltage control (Vctl) converter circuit 30 serves to convert input control voltage Vctl which has a variable value of between 0 and 3.3 volts into a current coupled to bias block generators 32a and 32b which bias the base of each of the transistors 20a and 20b respectively. Thus, a current proportional to the voltage signal Vctl is provided to bias the base of the two transistors 20a and 20b.

Blocks 34a and 34b each consist of a high value bleed resistor having a value of over 1 or 2 KΩ and preferably greater than about 5 KΩ. Adjacent to and coupled with each of the bleed resistors Rbleed 1 and Rbleed 2 is a PMOS transistor. When the PMOS transistors are in an OFF state, the associated bleed resistors partially bypass the PMOS transistor to improve the linearity of the power control profile of the amplifier.

Shunt circuit blocks 36a and 36b are coupled to a DC voltage source and the base of the transistors 20a and 20b respectively. Shunt circuit block 36 consists of a capacitor coupled in series with a PMOS transistor. Operationally the shunt block 36 redirects an RF signal present at the IN terminal to an analog ground terminal VCC0 in order to prevent the power amplifier from operating in a Class B mode of operation. This extends the dynamic range of the power control while maintaining the nominal power level at the IN terminal. It is preferred that the MOS gate within the shunt block have a substantially low resistance when the switch is ON such that it shunts AC signals at the base of the transistor as intended. Notwithstanding, it is preferred that the MOS gate have a low leakage ability and thus a suitably high resistance when the gate is switched off preventing AC signals from being shunted. Thus, for example, the resistance of the gate when it is switched on should be less than 20Ω and preferably less than 5Ω, and when the gate is switched off the resistance should be greater than 100Ω, and preferably greater than 200Ω.

Conveniently the PMOS gate within the shunt block 36 connected to a positive voltage supply VCCO is used to provide an active-high shunt block; thus when Vctl is high, and has a positive voltage applied, thus the output power is high, the shunt blocks 36a and 36b are in an OFF state. Of course, inverted logic and voltages could be used in an alternative embodiment. The capacitor in series with the PMOS gate within blocks 36a and 36b prevents DC current from flowing through the PMOS gate.

The advantages of this shunt circuit are significant. The provision of fast MOS and bipolar junction transistors (BiCMOS) is most practicable using silicon germanium technology.

The amplifier described heretofore controlled in part by an applied control voltage applied to a terminal Vctl and having an improved performance in view of the Shunt attenuator circuits 36a, 36b and the bleed resistor blocks 34a and 34b is also controlled by a master digital switch 38 having a terminal Vramp which allows the amplifier to be switched ON or OFF in a binary fashion, regardless of the voltage applied at the Vctl terminal, as opposed to conventional prior art circuits where a switch is disposed at the collector of the power transistors In summary, the circuit shown in FIG. 3 has various significant advantages over prior art amplifying circuits for use in battery powered telephony. Due to the variable control of the amplifier's output response being coupled to and dependent upon the provision of current to the base of the amplifying transistors rather than the collector, power conservation is afforded. The provision of two switches in series, wherein a master digital switch 38 is serially connected to a variable switch operated by a voltage at Vctl provides the ability to switch on and off the amplifier without regard to the voltage level at Vctl; this also allows resumption of the voltage level at Vctl when the digital switch is switched ON. This is particularly advantageous when transmission is in bursts and the amplifier is being rapidly switched ON and OFF. Furthermore, bleed resistors 34a and 34b provide a more linear power control profile. Yet still further, shunt circuits coupled to the base of the amplifying transistors prevent the amplifier from operating in unwanted modes of operation. Providing this topology of fast switching BJTs and CMOS gates is manufactureable and is practicable with SiGe technology.

What is claimed is:

1. A BiCMOS circuit for amplifying an input signal comprising:

a) a first transistor having a base, a collector and an emitter, the base for receiving the input signal, the first transistor for pre-amplifying the input signal to provide a pre-amplified signal;

b) a second transistor having a base, emitter and collector, the base being coupled with the first pre-amplifying transistor for receiving and amplifying the pre-amplified signal;

c) a first bias block generator for receiving a variable voltage independent of the pre-amplified signal and of the amplified pre-amplified signal and for biasing the base of one of the first and second transistors to a plurality of operating states; and, d) a circuit coupled to the base of at least one of the first and second transistors for providing variable shunting of AC signals present at the base of one of the first and second transistors to a distal location from the base, in dependence upon the variable voltage.

2. A BiCMOS circuit as defined in claim 1, wherein the circuit for shunting is coupled between the base of the first transistor and a voltage terminal for providing the BiCMOS circuit with an operating voltage.

3. A BiCMOS circuit as defined in claim 1 wherein the circuit for shunting includes a capacitor and transistor in series, the transistor in a first operating state for providing a path for the AC signals to pass through the capacitor to a destination, the transistor in a second operating state substantially preventing the AC signals from passing through the capacitor.

4. A BiCMOS circuit as defined in claim 3 wherein the transistor is a MOS transistor.

5. A BiCMOS circuit as defined in claim 4, wherein the MOS transistor is a PMOS device operable to pass current from one of a source and drain to the other, in the presence of a suitable voltage and operable to substantially prevent current from passing from one of a source and drain to the other in the absence of the suitable voltage.

6. A BiCMOS circuit as defined in claim 1, wherein the first bias block generator includes a plurality of bipolar junction transistors, for biasing a gain stage of the circuit.

7. A BiCMOS power amplifier comprising:
a first bipolar junction transistor having a base, a collector and an emitter;
a control voltage terminal for biasing the base of the first bipolar junction transistor and for providing a plurality of voltage values to the base; and,
a circuit for shunting unwanted AC signals present at the base of the first bipolar junction transistor to a distal location from the base, said circuit for shunting being variably actuatable in proportion to a magnitude of a control signal, the control signal other than a dependent upon an output of the first bipolar junction transistor.

8. A BiCMOS circuit as defined in claim 7 wherein the shunting circuit comprises a switch having a first terminal for receiving the control signal.

9. A BiCMOS circuit as defined in claim 8, wherein the switch is an electronic gate having a resistance of less than 20Ω when the gate is switched to shunt current therethrough, and having a resistance of more than 100Ω when the gate is an opposite state and switched to substantially prevent most current from passing therethrough.

10. A BiCMOS circuit as defined in claim 8 wherein the switch has a second terminal coupled to a capacitor.

11. A BiCMOS circuit as defined in claim 10 wherein the switch is a MOS device allowing current to flow variably from one of a source to a drain or oppositely in proportion to the variable control signal.

12. A BiCMOS circuit as defined in claim 11 wherein the variable control signal is a variable voltage.

13. A BiCMOS circuit as defined in claim 7, wherein the circuit for shunting is coupled between the base of the first transistor and a voltage terminal for providing the BiCMOS circuit with an operating voltage.

14. A BiCMOS circuit as defined in claim 7 wherein the circuit for shunting includes a capacitor and transistor in series, the transistor in a first operating state for providing a path for the AC signals to pass through the capacitor to a destination, the transistor in a second operating state substantially preventing the AC signals from passing through the capacitor.

15. A BiCMOS circuit as defined in claim 14 wherein the transistor is a MOS transistor.

16. A BiCMOS circuit as defined in claim 15, wherein the MOS transistor is a PMOS device operable to pass current from one of a source and drain to the other, in the presence of a suitable voltage and operable to substantially prevent current from passing from one of a source and drain to the other in the absence of the suitable voltage.

17. A BiCMOS circuit for amplifying an input signal comprising:

a) a first transistor having a base, a collector and an emitter, the base for receiving the input signal, the first transistor for pre-amplifying the input signal to provide a pre-amplified signal;

b) a second transistor having a base, emitter and collector, the base being coupled with the first pre-amplifying transistor for receiving and amplifying the pre-amplified signal;

c) a first bias block generator for receiving a variable voltage and for biasing the base of one of the first and second transistors to a plurality of operating states; and, d) a circuit coupled to the base of at least one of the first and second transistors for providing variable shunting of AC signals present at the base of one of the first and second transistors to a distal location from the base, in dependence upon the variable voltage, wherein the variable voltage controls the output power of the BiCMOS circuit.

18. A BiCMOS circuit comprising:

a) a first transistor having a base, a collector and an emitter, the base for receiving the input signal, the first transistor for pre-amplifying the input signal to provide a pre-amplified signal;

b) a second transistor having a base, emitter and collector, the base being coupled with the first pre-amplifying transistor for receiving and amplifying the pre-amplified signal;

c) a first bias block generator for receiving a variable voltage and for biasing the base of one of the first and second transistors to a plurality of operating states;

d) a circuit coupled to the base of at least one of the first and second transistors for providing variable shunting of AC signals present at the base of one of the first and second transistors to a distal location from the base, in dependence upon the variable voltage; and, e) a second circuit for shunting unwanted AC signals coupled to the base of the second transistor.

19. A BiCMOS power amplifier comprising:
a first bipolar junction transistor having a base, a collector and an emitter;
a control voltage terminal for biasing the base of the first bipolar junction transistor and for providing a plurality of voltage values to the base; and, a circuit for shunting unwanted AC signals present at the base of the first bipolar junction transistor to a distal location from the base, said circuit for shunting being variably actuatable in proportion to a magnitude of a control signal, wherein the control signal is present at the control voltage terminal, and wherein shunt passes current substantially inversely proportion to the magnitude of the control signal.

20. A BiCMOS power amplifier comprising:

a first bipolar junction transistor having a base, a collector and an emitter;

a control voltage terminal for biasing the base of the first bipolar junction transistor and for providing a plurality of voltage values to the base;

a circut for shunting unwanted AC signals present at the base of the first bipolar junction transistor to a distal location from the base, said circuit for shunting being variably actuatable in proportion to a magnitude of a control signal; and, a power control linearizing circut coupled with the base of the first bipolar junction transistor including a MOS transistor in parallel with a resistor having a resistance value of at greater than 1.5 kΩ.

21. A BiCMOS power amplifier as defined in claim 20, wherein the resistor has a value of at least 2 kΩ, and wherein the amplifier includes a second transistor, one of the first and second transistors being a pre-amplifying transistor, the other of the first and second transistors being an amplifying transistor coupled to receive a pre-amplified signal.

22. A BiCMOS power amplifier comprising:

a first bipolar junction transistor having a base, a collector and an emitter;

a control voltage terminal for biasing the base of the bipolar junction power transistor and for providing a plurality of voltage values to the base;

a circuit for shunting unwanted AC signals present at the base of the first bipolar junction transistor to a distal location from the base, said circuit for shunting being variably actuatable in proportion to a magnitude of a control signal; and, a second terminal for receiving a variable voltage and first terminal for receiving a fixed voltage, the first and second terminals being coupled to one another to provide a voltage proportional to the voltage provided at the second terminal to the base of the first bipolar junction transistor for controlling output power, and to provide substantially no voltage to the base of the first bipolar junction transistor when a switch coupled to the first terminal is open.

\* \* \* \* \*